United States Patent
Kobayashi

(10) Patent No.: US 9,509,277 B2
(45) Date of Patent: Nov. 29, 2016

(54) PIEZOELECTRIC VIBRATOR AND METHOD OF MANUFACTURING PIEZOELECTRIC VIBRATOR

(71) Applicant: SII Crystal Technology Inc., Chiba-shi, Chiba (JP)

(72) Inventor: Takashi Kobayashi, Chiba (JP)

(73) Assignee: SII CRYSTAL TECHNOLOGY INC., Chiba (JP)

( * ) Notice: Subject to any disclaimer, the term of this patent is extended or adjusted under 35 U.S.C. 154(b) by 0 days.

(21) Appl. No.: 14/976,893

(22) Filed: Dec. 21, 2015

(65) Prior Publication Data

US 2016/0190426 A1  Jun. 30, 2016

(30) Foreign Application Priority Data

Dec. 25, 2014  (JP) .................. 2014-262941

(51) Int. Cl.
  *H03H 9/21* (2006.01)
  *H03H 9/05* (2006.01)

(52) U.S. Cl.
  CPC ............. *H03H 9/21* (2013.01); *H03H 9/0509* (2013.01)

(58) Field of Classification Search
  CPC ...... H03H 9/21; H03H 9/215; H03H 9/2468; H03H 9/2473; H03H 9/2484; H03H 9/2494
  USPC ................................................. 310/370, 344
  See application file for complete search history.

(56) References Cited

U.S. PATENT DOCUMENTS

| 8,692,632 B2* | 4/2014 | Yamada | ............... H03H 9/0547 310/370 |
| 2004/0201326 A1* | 10/2004 | Yokoi | ................... H04R 17/00 310/348 |

FOREIGN PATENT DOCUMENTS

| JP | 2004-357178 A | 12/2004 |
| JP | 2005-102138 A | 4/2005 |
| JP | 2011-019159 A | 1/2011 |

* cited by examiner

*Primary Examiner* — J. San Martin
(74) *Attorney, Agent, or Firm* — Brinks Gilson & Lione

(57) ABSTRACT

A piezoelectric vibrator has a piezoelectric vibrating reed mounted on an upper layer base substrate through a conductive adhesive, in which the piezoelectric vibrating reed includes a first vibrating arm and a second vibrating arm extending along a first direction and arranged side by side in a second direction, a base supporting the first vibrating arm and the second vibrating arm and a first support arm and a second support arm positioned in the outer side of the first vibrating arm and the second vibrating arm in the second direction and bonded to the upper layer base substrate, in which an extrusion amount of the conductive adhesive in the inner side of the first support arm and the second support arm is smaller than an extrusion amount of the conductive adhesive in the outer side of the first support arm and the second support arm.

4 Claims, 8 Drawing Sheets

SECOND DIRECTION  FIRST DIRECTION
THIRD DIRECTION

FIRST DIRECTION
SECOND DIRECTION
THIRD DIRECTION

PIEZOELECTRIC VIBRATOR AND METHOD OF MANUFACTURING PIEZOELECTRIC VIBRATOR

RELATED APPLICATIONS

This application claims priority under 35 U.S.C. §119 to Japanese Patent Application No. 2014-262941 filed on Dec. 25, 2014, the entire content of which is hereby incorporated by reference.

BACKGROUND OF THE INVENTION

1. Field of the Invention

The present invention relates to a piezoelectric vibrator and a method of manufacturing the piezoelectric vibrator.

2. Description of Related Art

In a cellular phone or a portable information terminal device, a piezoelectric vibrator formed of a crystal or the like is used as a time source, a timing source of a control signal, a reference signal source and so on. As one of these types of piezoelectric vibrators, a piezoelectric vibrator which houses a piezoelectric vibrating reed in a vacuum sealed cavity is known. In the piezoelectric vibrator, a voltage is applied to an excitation electrode formed in vibrating arms, thereby vibrating the vibrating arms with a predetermined resonance frequency.

As the piezoelectric vibrating reed, there is known a so-called side-arm type piezoelectric vibrating reed in which a pair of support arms are provided so as to extend from a base to which a pair of vibrating arms are connected at both outer sides of the vibrating arms. The side-arm type piezoelectric vibrating reed is mounted by bonding the support arms to a packaging substrate through a conductive adhesive (for example, refer to JP-A-2004-357178 (Patent Document 1)). Generally, in a mounting process of the piezoelectric vibrating reed, a method in which the piezoelectric vibrating reed is carried to and placed in a mounting position in the package by vacuum sucking the base which has the broadest suction area by a suction nozzle is adopted.

In recent years, the request for size reduction is increasing also with respect to the side-arm type piezoelectric vibrating reed as the size of the piezoelectric vibrator becomes small (for example, refer to JP-A-2005-102138 (Patent Document 2).

SUMMARY OF THE INVENTION

However, as the size of the piezoelectric vibrating reed becomes small, the distance between the suction nozzle which sucks the piezoelectric vibrating reed and an application region of the conductive adhesive corresponding to the support arms tends to be short. Therefore, there is a danger that the conductive adhesive before curing is sucked by the suction nozzle, flows toward the base and the vibrating arms and adheres to the vibrating arms in the mounting process of the piezoelectric vibrating reed.

In the case where the conductive adhesive adhering to the vibrating arms is solidified, the vibration loss is increased as well as a crystal impedance value (hereinafter, referred to as a "CI value") is increased in the piezoelectric vibrator, therefore, there is a danger that good vibration characteristics are not obtained.

In view of the above circumferences, an object of the present invention is to provide a piezoelectric vibrator and a method of manufacturing the piezoelectric vibrator capable of preventing a conductive adhesive from adhering to vibrating arms, reducing the size and as securing good vibration characteristics.

According to an embodiment to the present invention, there is provided a piezoelectric vibrator having a piezoelectric vibrating reed mounted on a substrate through a conductive adhesive, in which the piezoelectric vibrating reed includes a pair of vibrating arms extending along a first direction and arranged side by side in a second direction perpendicular to the first direction, a base supporting the pair of vibrating arms and a pair of support arms positioned in the outer side of the pair of vibrating arms in the second direction and extending so as to cross the second direction as well as bonded to the substrate, in which an extrusion amount of the conductive adhesive in the inner side of the support arms is smaller than an extrusion amount of the conductive adhesive in the outer side of the support arms in bonded portions between the support arms and the substrate.

In the present invention, the extrusion amount of the conductive adhesive in the inner side of the support arms is smaller than the extrusion amount of the conductive adhesive in the outer side of the support arms. Accordingly, when the piezoelectric vibrating reed sucked and carried by the suction nozzle is mounted on the package, it is possible to restrain the conductive adhesive extruding to the inner side of the support arms which is closer to the suction nozzle from being sucked by the suction nozzle, flowing out and adhering to the vibrating arms. Therefore, the piezoelectric vibrator capable of preventing the conductive adhesive from adhering to the vibrating arms, reducing the size and securing good vibration characteristics can be obtained.

The conductive adhesive according to the embodiment may have an elliptical shape in plan view having a long axis along the first direction.

In the present invention, the piezoelectric vibrating reed can be firmly bonded to the substrate while suppressing the extrusion amount of the conductive adhesive in the inner side of the support arms. Therefore, the piezoelectric vibrator capable of preventing the conductive adhesive from adhering to the vibrating arms, reducing the size and securing good vibration characteristics as well as having good durability can be obtained.

The conductive adhesive according to the embodiment may be arranged closer to the tip end side with respect to an intermediate part in the first direction.

In the present invention, the conductive adhesive is arranged in a position apart from the suction nozzle which sucks the base in the direction along the first direction. Accordingly, it is possible to surely prevent the conductive adhesive from being sucked by the suction nozzle which sucks the base. Therefore, the piezoelectric vibrator capable of preventing the conductive adhesive from adhering to the vibrating arms, reducing the size and securing good vibration characteristics can be obtained.

A height of the conductive adhesive in the inner side of the support arms from the surface of the substrate may be lower than a height of the conductive adhesive in the outer side of the support arms from the surface of the substrate.

In the present invention, the conductive adhesive in the inner side of the support arms is arranged in the position apart from the suction nozzle which sucks the base as compared with the conductive adhesive in the outer side of the support arms in the height direction from the substrate. Accordingly, it is possible to surely prevent the conductive adhesive from being sucked by the suction nozzle which sucks the base. Therefore, the piezoelectric vibrator capable of preventing the conductive adhesive from adhering to the vibrating arms, reducing the size and securing good vibration characteristics can be obtained.

Also according to the embodiment of the present invention, there is provided a method of manufacturing a piezoelectric vibrator including the steps of discharging the conductive adhesive to electric pads on the substrate from a supply nozzle of an application apparatus and mounting the piezoelectric vibrating reed on the substrate by pressing and bonding the support arms of the piezoelectric vibrating reed to the electrode pads through the conductive adhesive, in which the conductive adhesive is applied in a state where a tip end of the supply nozzle is positioned in the outer side of an intermediate part in a width direction of the support arm in the application process.

In the present invention, in the application process, the conductive adhesive is applied in the state where the tip end of the supply nozzle is positioned in the outer side of the intermediate part in the width direction of the support arm, therefore, more conductive adhesive is applied to the outer side than to the intermediate part in the width direction the support arms. At this time, in the mount process for the piezoelectric vibrating reed, the extrusion amount of the conductive adhesive in the inner side of the support arms is controlled to be smaller than the extrusion amount of the conductive adhesive in the outer side of the support arms. Accordingly, it is possible to surely prevent the conductive adhesive from being sucked by the suction nozzle which sucks the base. Therefore, the piezoelectric vibrator capable of preventing the conductive adhesive from adhering to the vibrating arms, reducing the size and securing good vibration characteristics can be obtained.

In the present invention, the extrusion amount of the conductive adhesive in the inner side of the support arms is smaller than the extrusion amount of the conductive adhesive in the outer side of the support arms. Accordingly, when the piezoelectric vibrating reed sucked and carried by the suction nozzle is mounted on the package, it is possible to restrain the conductive adhesive extruding to the inner side of the support arms which is closer to the suction nozzle from being sucked by the suction nozzle, flowing out and adhering to the vibrating arms. Therefore, the piezoelectric vibrator capable of preventing the conductive adhesive from adhering to the vibrating arms, reducing the size and securing good vibration characteristics can be obtained.

DETAILED DESCRIPTION OF THE PREFERRED EMBODIMENT

Hereinafter, an embodiment according to the present invention will be explained with reference to the drawings.

Figure 1:
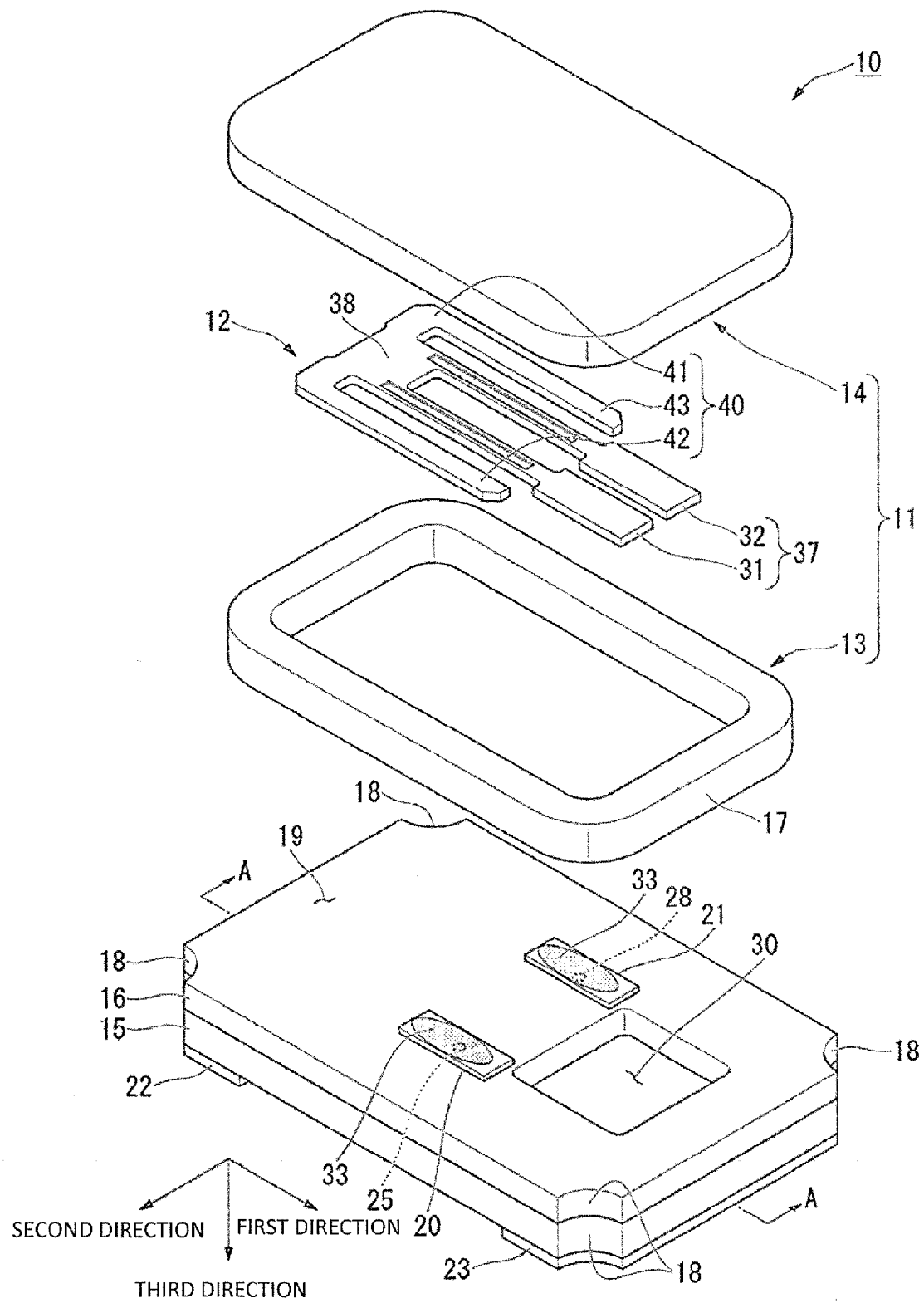
FIG. 1 is an exploded perspective view of a piezoelectric vibrator according to an embodiment of the present invention.
Figure 2:
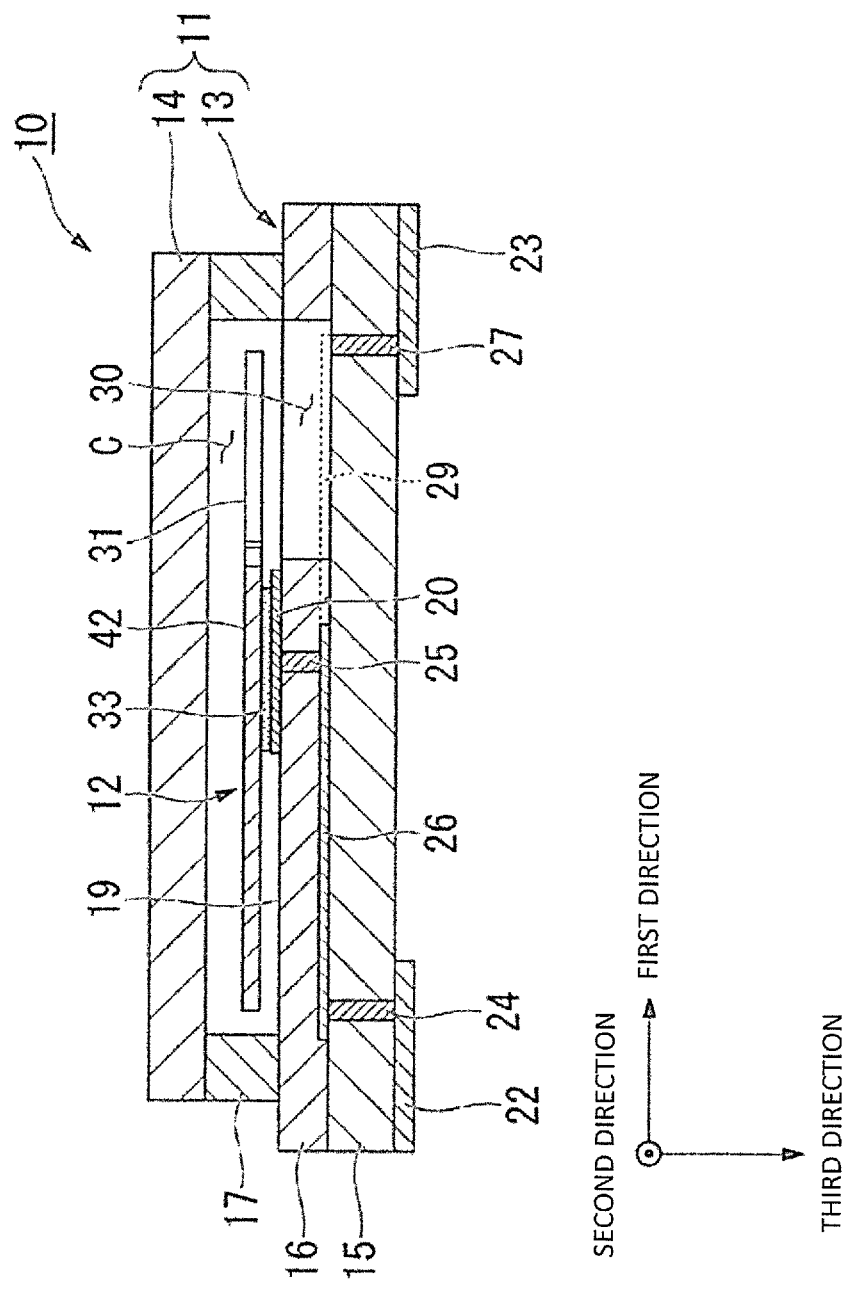
FIG. 2 is a cross-sectional view taken along A-A line of FIG. 1.

FIG. 1 is an exploded perspective view of a piezoelectric vibrator according to an embodiment of the present invention, and FIG. 2 is a cross-sectional view taken along A-A line of FIG. 1.

As shown in FIG. 1 and FIG. 2, a piezoelectric vibrator 10 according to the embodiment is a ceramic-package type surface mounted vibrator including a package 11 having a hermetically sealed cavity C thereinside and a piezoelectric vibrating reed 12 housed in the cavity C.

The piezoelectric vibrator 10 is formed to have an approximately rectangular parallelepiped shape. In the embodiment, a longitudinal direction of the piezoelectric vibrator 10 in plan view is defined as a first direction, a short direction is defined as a second direction and a direction orthogonal to the first direction and the second direction is defined as a third direction.

The package 11 includes a package body 13 and a sealing plate 14 bonded to the package body 13 and forming the cavity C with the package body 13.

The package body 13 includes a lower layer base substrate 15 and an upper layer base substrate 16 (corresponding to a "substrate" in claims) which are bonded in an overlapping state, and a sealing ring 17 bonded onto a surface of the upper layer base substrate 16.

The lower layer base substrate 15 is a ceramic substrate formed in an approximately rectangular shape in plan view. The upper layer base substrate 16 is a ceramic substrate formed in an approximately rectangular shape in plan view, which is the same outer shape as the lower layer base substrate 15, and is integrally bonded in a state of being stacked on the lower layer base substrate 15 by sintering and so on.

At four corners of the lower layer base substrate 15 and the upper layer base substrate 16, cut-out portions 18 each having a ¼ arc shape in plan view are formed over the entire portion in the third direction. The lower layer base substrate 15 and the upper layer base substrate 16 are fabricated by, for example, after stacking two pieces of wafer-shaped ceramic substrates and bonding them to each other, forming plural through holes penetrating through both ceramic substrates in a matrix shape and cutting both ceramic substrates in a lattice shape by using respective through hole as references.

In that case, each through hole is divided into four, thereby foil ling the above cut-out portions 18. An upper surface of the upper layer base substrate 16 is a mount surface 19 on which the piezoelectric vibrating reed 12 is mounted.

The lower layer base substrate 15 and the upper layer base substrate 16 are made of ceramic. As specific ceramic materials, for example, HTCC (High Temperature Co-Fired Ceramic) made of alumina, LTCC (Low Temperature Co-Fired Ceramic) made of glass ceramic and the like can be cited.

The sealing ring 17 is a conductive frame-like member slightly smaller than the outer shape of the lower layer base substrate 15 and the upper layer base substrate 16, which is bonded to the mount surface 19 of the upper layer base substrate 16.

Specifically, the sealing ring 17 is bonded onto the mount surface 19 by baking using a brazing filler material such as silver brazing, a solder material and so on, or bonded by welding with respect to a metal bonding layer formed on the mount surface 19 (formed by, for example, electroplating, electroless plating, deposition, sputtering and so on).

As materials for the sealing ring 17, for example, nickel based alloys and so on can be cited. Specifically, it is possible to select the material from Kovar, Elinvar, Invar, 24-alloy and so on. It is particularly preferable to select the material for the sealing ring 17 having a thermal expansion coefficient close to that of the lower layer base substrate 15 and the upper layer base substrate 16 made of ceramic. For example, when alumina with a thermal expansion coefficient 6.810-6/° C. is used for the lower layer base substrate 15 and the upper layer base substrate 16, Koval with a thermal expansion coefficient 5.210-6/° C. or 42-alloy with a thermal expansion coefficient 4.5 to 6.510-6/° C. is preferably used for the sealing ring 17.

The sealing plate 14 is a conductive substrate staked onto the sealing ring 17, which is hermetically bonded to the package body 13 by the bonding with respect to the sealing ring 17. A space demarcated by the sealing plate 14, the sealing ring 17 and the mount surface 19 of the upper layer base substrate 16 functions as the cavity C which is hermetically sealed.

As a method of welding the sealing plate 14, for example, seam welding performed by the contact of a roller electrode, laser welding, ultrasonic welding and so on can be cited. It is preferable that a bonding layer such as nickel, gold and so on which are familiar to each other is respectively formed at least on a lower surface of the sealing plate 14 and an upper surface of the sealing ring 17 for welding between the sealing plate 14 and the sealing ring 17 more firmly.

On the mount surface 19 of the upper layer base substrate 16, a pair of first electrode pad 20 and second electrode pad 21 as electrodes connecting to the piezoelectric vibrating reed 12 are formed at an interval in a width direction. On a lower surface of the lower layer base substrate 15, a pair of first external electrode 22 and second external electrode 23 are formed at an interval in a longitudinal direction.

Each of the first electrode pad 20, the second electrode pad 21, the first external electrode 22 and the second external electrode 23 are, for example, a single layer film including a single metal formed by deposition, sputtering and so on, or a stacked film in which different metals are stacked, and these electrodes are electrically connected to one another.

In the lower layer base substrate 15, one first through electrode 24 electrically connected to the first external electrode 22 and penetrating through the lower layer base substrate 15 in a thickness direction is formed. In the upper layer base substrate 16, one second through electrode 25 electrically connected to the first electrode pad 20 and penetrating through the upper layer base substrate 16 in the thickness direction is formed. A first connection electrode 26 connecting one first through electrode 24 to one second through electrode 25 is formed between the lower layer base substrate 15 and the upper layer base substrate 16. Accordingly, the first electrode pad 20 and the first external electrode 22 are electrically connected to each other.

On the other hand, in the lower layer base substrate 15, the other first through electrode 27 electrically connected to the second external electrode 23 and penetrating through the lower layer base substrate 15 in the thickness direction is formed. In the upper layer base substrate 16, the other second through electrode 28 electrically connected to the second electrode pad 21 and penetrating through the upper layer base substrate 16 in the thickness direction 16 is formed. A second connection electrode 29 connecting the other first through electrode 27 to the other second through electrode 28 is formed between the lower layer base substrate 15 and the upper layer base substrate 16. Accordingly, the second electrode pad 21 and the second external electrode 23 are connected to each other.

The second connection electrode 29 is patterned so as to extend along the sealing ring 17, for example, under the sealing ring 17 for avoiding a later-described concave portion 30.

On the mount surface 19 of the upper layer base substrate 16, the concave portion 30 is formed at a part facing tip end portions of a later-described first vibrating arm 31 and a second vibrating arm 32 of the piezoelectric vibrating reed 12. The concave portion 30 is provided for avoiding contact between the first vibrating arm 31/second vibrating arm 32 and the upper layer base substrate 16 occurring when the first vibrating arm 31 and second vibrating arm 32 are displaced (flexural deformation) in the thickness direction by effects of the impact such as fall. The concave portion 30 is a through hole penetrating through the upper layer base substrate 16, and is formed to be a square shape in plan view having rounded four corners inside the sealing ring 17.

The later-described piezoelectric vibrating reed 12 is mounted so that a pair of first support arm 42 and second support arm 43 contact the first electrode pad 20 and the second electrode pad 21 respectively through a conductive adhesive 33. Accordingly, the piezoelectric vibrating reed 12 is supported in a state of being floated from the mount surface 19 of the upper layer base substrate 16 as shown in FIG. 2, and are electrically connected to the pair of first electrode pad 20 and second electrode pad 21 respectively. The details of an application position and so on of the conductive adhesive 33 will be explained later.

Figure 3:
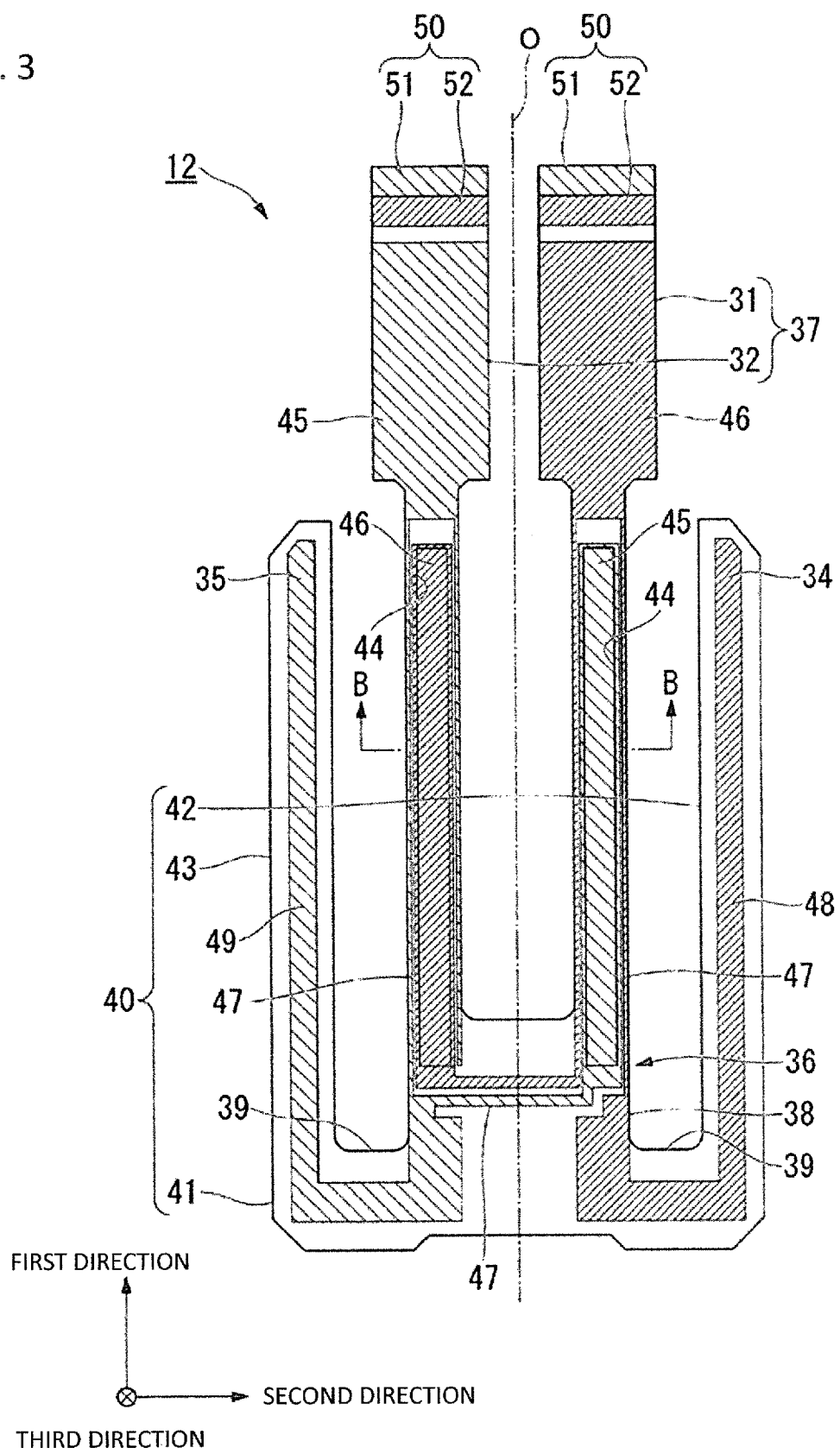
FIG. 3 is a plan view of a piezoelectric vibrating reed.

FIG. 3 is a plan view of the piezoelectric vibrating reed. In FIG. 3, a central axis O of the piezoelectric vibrating reed 12 is shown by a dashed line.

The piezoelectric vibrating reed 12 includes a piezoelectric plate 36 formed of a piezoelectric material such as crystal, lithium tantalite, lithium niobate or the like.

The piezoelectric plate 36 includes a vibrating portion 37 formed so as to extend in the first direction and a base 38 supporting a base end portion of the vibrating portion 37. The vibrating portion 37 has the pair of first vibrating arm 31 and second vibrating arm 32 which are arranged side by side in the second direction so as to interpose the central axis O. The pair of first vibrating arm 31 and second vibrating arm 32 are arranged so as to extend along the first direction. A width of each first vibrating arm 31 and second vibrating arm 32 at the tip end side in the second direction is wider than a width of the base end side in the second direction.

The base 38 connects one end portions of the pair of first vibrating arm 31 and second vibrating arm 32 in the first direction. A support portion 40 is connected to the base 38 through a connecting portion 39. The support portion 40 includes a support arm base 41 and the pair of first support arm 42 and second support arm 43.

The connecting portion 39 is provided between the base 38 and the support arm base 41. The connecting portion 39 extends from both end surfaces of the base 38 in the second direction toward the outer side in the second direction and is connected to the support arm base 41. The pair of first support arm 42 and second support arm 43 extend along the first direction so as to be perpendicular to the second direction from the support arm base 41. The pair of first support arm 42 and second support arm 43 are arranged in the outer side of the vibrating portion 37 in the second direction. The piezoelectric vibrating reed 12 is a so-called side arm type piezoelectric vibrating reed 12 in which the vibrating portion 37 is arranged between the pair of first support arm 42 and second support arm 43 in the second direction.

Figure 4:
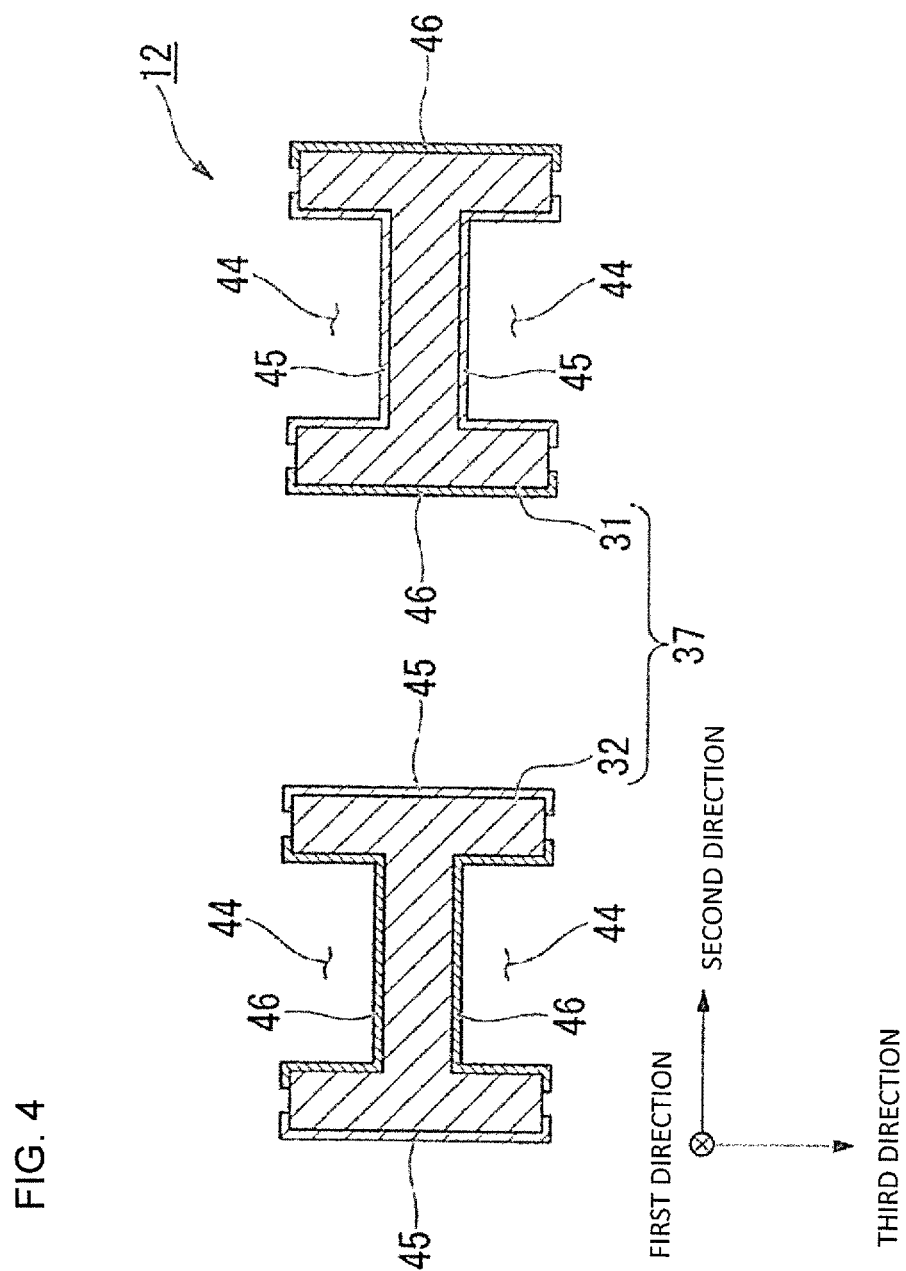
FIG. 4 is a cross-sectional view taken along B-B line of FIG. 3.

FIG. 4 is a cross-sectional view taken along B-B line of FIG. 3.

As shown in FIG. 3 and FIG. 4, groove portions 44 each having a fixed width extending along the first direction are formed on main surfaces (front and back surfaces in both sides in the third direction) of the pair of first vibrating arm 31 and second vibrating arm 32. The groove portions 44 are formed over a range from the base end portion side to an intermediate part of the first vibrating arm 31 and the second vibrating arm 32. Each of the pair of first vibrating arm 31 and second vibrating arm 32 has an H-shape in cross section as shown in FIG. 4.

As shown in FIG. 3, on an outer surface of the piezoelectric plate 36, a first excitation electrode 45, a second excitation electrode 46, a first mount electrode 34 and a second mount electrode 35 are respectively formed. In the above components, the pair of first excitation electrode 45 and second excitation electrode 46 are electrodes which vibrate the pair of the first vibrating arm 31 and second vibrating arm 32 with a predetermined resonance frequency in a direction approaching each other or separating from each other when a voltage is applied, which are patterned in a state of being electrically disconnected to each other on outer surfaces of the pair of first vibrating arm 31 and second vibrating arm 32.

Specifically, the first excitation electrode 45 is chiefly formed in the groove portion 44 of the first vibrating arm 31 and a side surface of the second vibrating arm 32, and the second excitation electrode 46 is chiefly formed in a side surface of the first vibrating arm 31 and the groove portion 44 of the second vibrating arm 32 as shown in FIG. 4.

The pair of first excitation electrode 45 and second excitation electrode 46 are electrically connected to base extraction electrodes 47 formed on outer surfaces including a main surface and side surfaces of the base 38, respectively.

The pair of first mount electrode 34 and second mount electrode 35 are provided in regions on main surfaces of the pair of first support arm 42 and second support arm 43 as well as closer to the tip end side with respect to the intermediate part in the first direction. The pair of first mount electrode 34 and second mount electrode 35 are electrically connected from the based extraction electrode 47 through a first arm extraction electrode 48 and a second arm extraction electrode 49. The first arm extraction electrode 48 and the second arm extraction electrode 49 are respectively formed along the connecting portion 39, the support arm base 41, and main surfaces of the first support arm 42 and the second support arm 43.

A voltage is applied to the pair of first excitation electrode 45 and the second excitation electrode 46 through the pair of first mount electrode 34 and second mount electrode 35.

The above respective electrodes which are the first excitation electrode 45, the second excitation electrode 46, the first mount electrode 34, the second mount electrode 35, the base extraction electrodes 47, the first arm extraction electrode 48 and the second arm extraction electrode 49 are stacked films including, for example, chromium (Cr) and gold (Au), which are formed by applying a gold thin film on the surface after depositing a chrome film which has good adhesion with respect to crystal as a base. However, the present invention is not limited to the above, and it is also possible to further stack the gold thin film on the surface of the stacked film including, for example, chrome and Nichrome (NiCr) and it is also possible to form a single layer film including, for example, chrome, nickel, aluminum (Al) or titanium (Ti).

In tip end portions of the pair of first vibrating arm 31 and second vibrating arm 32, weight metal films 50 are formed for adjusting vibrating states of the arms so as to vibrate within a given range of frequencies (frequency adjustment) as shown in FIG. 3. The weight metal films 50 each includes a coarse adjustment film 51 and a fine adjustment film 52. Frequencies of the pair of first vibrating arm 31 and second vibrating arm 32 fall into a range of a nominal frequency of the device by adjusting frequencies using the weight metal films 50.

Figure 5:
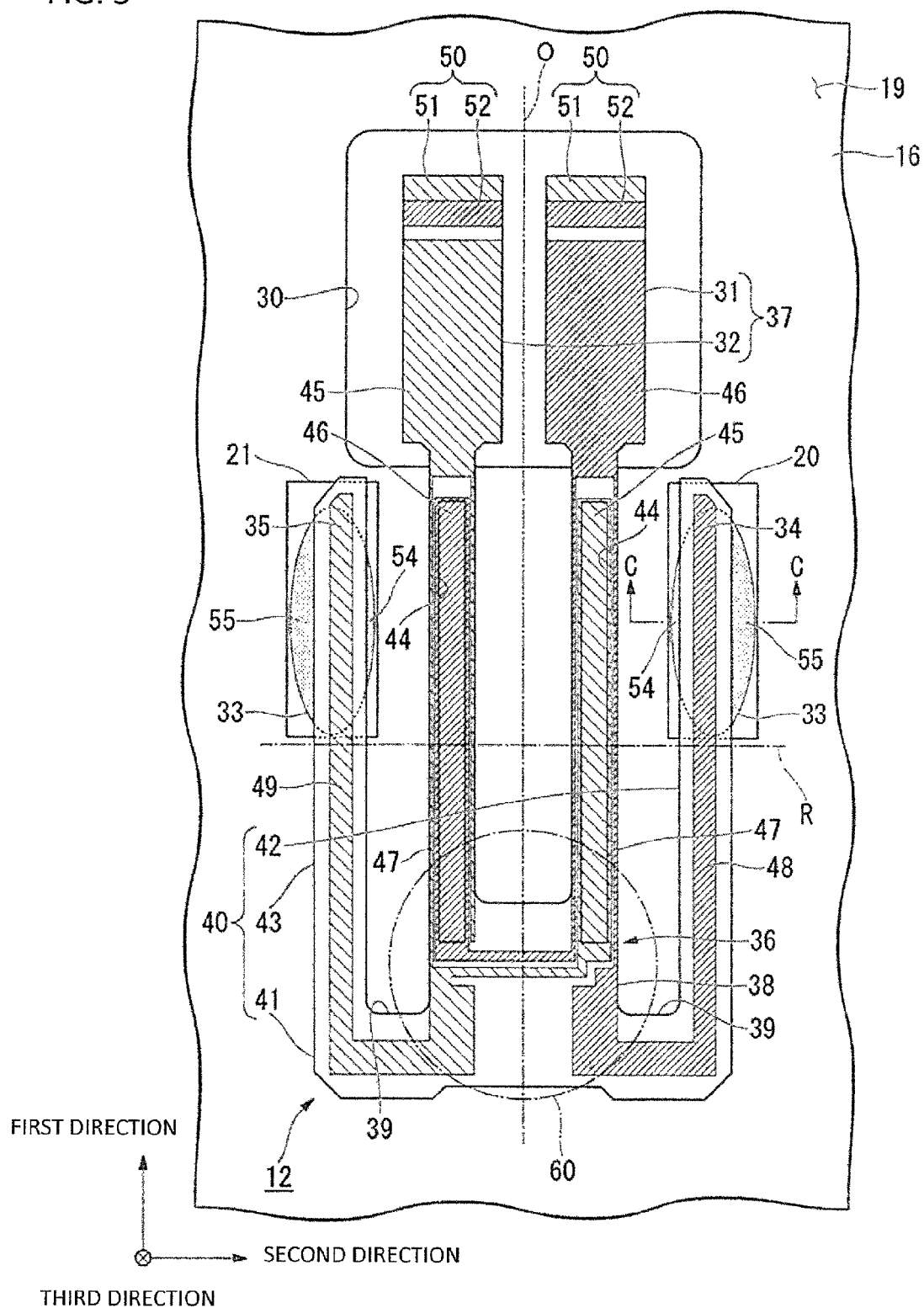
FIG. 5 is a plan view of the piezoelectric vibrating reed mounted on an upper layer base substrate.
Figure 6:
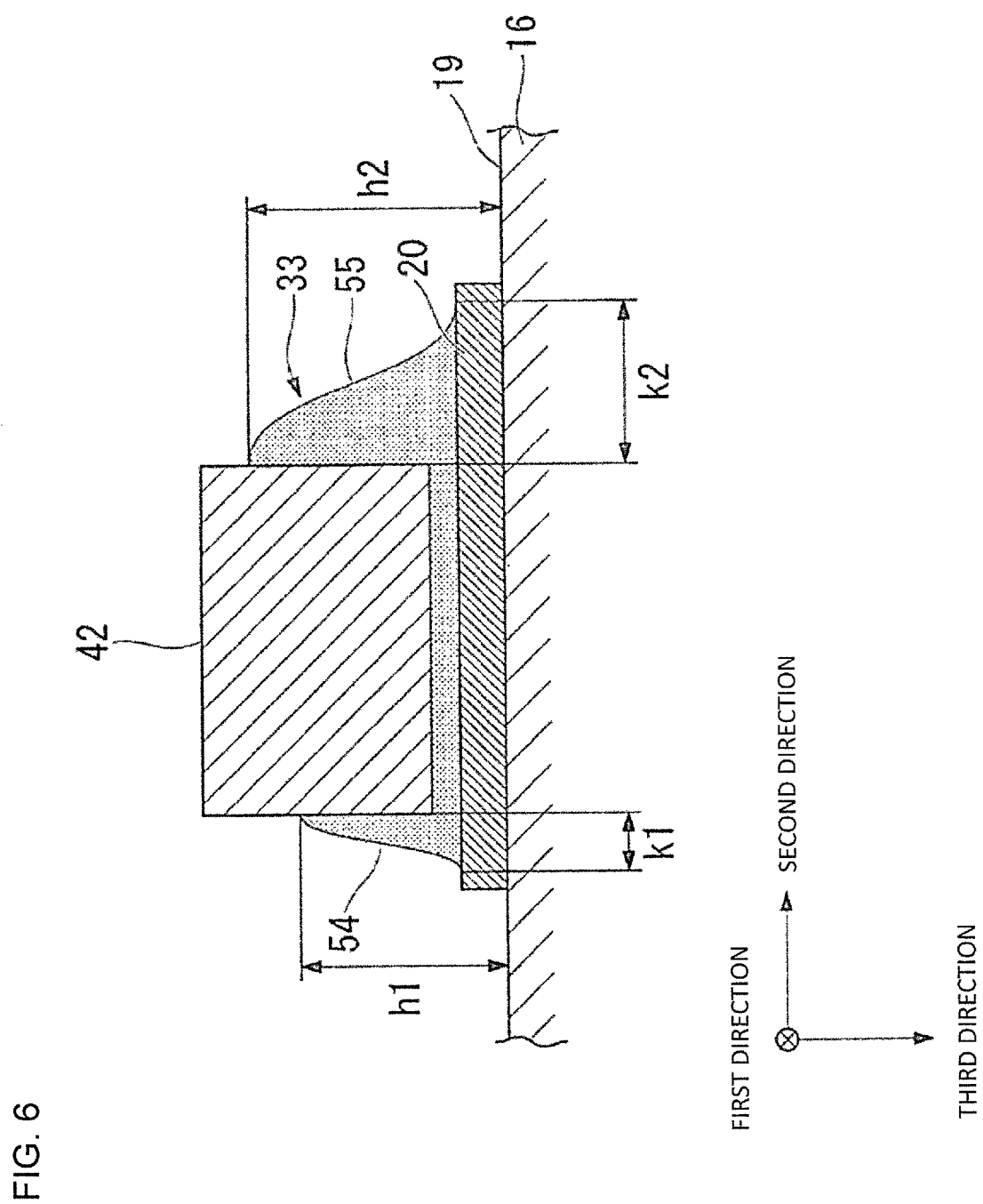
FIG. 6 is a cross-sectional view taken along C-C line of FIG. 5.

FIG. 5 is a plan view of the piezoelectric vibrating reed mounted on the upper layer base substrate and FIG. 6 is a cross-sectional view taken along C-C line of FIG. 5. In FIG. 5, a suction nozzle 60 suctioning the base 38 is shown by a two-dot dashed line.

As shown in FIG. 5, the piezoelectric vibrating reed 12 is bonded to the upper layer base substrate 16 through the conductive adhesive 33.

In the first support arm 42 and the second support arm 43, the first mount electrode 34 and the second mount electrode 35 are respectively connected to the first electrode pad 20 and the second electrode pad 21 in the upper layer base substrate 16.

The first mount electrode 34/the second mount electrode 35 and the first electrode pad 20/the second electrode pad 21 are fixed by the conductive adhesive 33. The conductive adhesive 33 in a softened state is applied to the first electrode pad 20 and the second electrode pad 21 in a later-described application process. In the piezoelectric vibrating reed 12, the first support arm 42 and the second support arm 43 are placed onto the upper layer base substrate 16 while being pressed thereon so that the conductive adhesive 33 contacts the first mount electrode 34 and the second mount electrode 35 in a later-described mount process. The first support arm 42 and the second support arm 43 are fixed to the upper layer base substrate 16 when the conductive adhesive 33 is solidified through the first electrode pad 20, the second electrode pad 21 and the conductive adhesive 33.

The piezoelectric vibrator 10 is set so that an extrusion amount of the conductive adhesive 33 in the inner side of the first support arm 42 and the second support arm 43 is smaller than an extrusion amount of the conductive adhesive 33 in the outer side of the first support arm 42 and the second support arm 43 in bonded portions between the first support arm 42/second support arm 43 and the upper base substrate 16.

Here, the "extrusion amount" corresponds to the size of the conductive adhesive 33 extruding from edges of the first support arm 42 and the second support arm 43 along the width direction (corresponding to the second direction in the embodiment) of the respective first support arm 42 and the second support arm 43 in plan view of the first support arm 42 and the second support arm 43.

The conductive adhesive 33 is formed to have an elliptical shape in plan view having a long axis along a longitudinal direction of the first support arm 42 and the second support arm 43. Here, the elliptical shape in plan view includes an ellipse, an oval and a rectangle corners of which are chamfered.

The conductive adhesive 33 is also arranged closer to the tip end side in the first direction with respect to the intermediate part of the first support arm 42 and the second support arm 43 in the longitudinal direction. In FIG. 5, a boundary line in the intermediate part of the first support arm 42 and the second support arm 43 in the longitudinal direction is shown by a dashed line R.

Here, in FIG. 5 and FIG. 6, an extrusion portion in the inner side of the first support arm 42 is defined as an inside extrusion portion 54 and an extrusion portion in the outer side of the first support arm 42 is defined as an outside extrusion portion 55 in extrusion portions of the conductive adhesive 33 bonding the first support arm 42. Extrusion portions of the conductive adhesive 33 bonding the second support arm 43 are also defined as the inside extrusion portion 54 and the outside extrusion portion 55 in the same manner.

As shown in FIG. 6, an extrusion size "k1" of the inside extrusion portion 54 of the conductive adhesive 33 along the second direction is smaller than an extrusion size "k2" of the outside extrusion portion 55 along the second direction. A height "h1" of the inside extrusion portion 54 of the conductive adhesive 33 from the surface of the upper base substrate 16 is lower than a height "h2" of the outside extrusion portion 55 from the surface of the upper base substrate 16. A cross-sectional area of the inside extrusion portion 54 of the conductive adhesive 33 is smaller than a cross-sectional area of the outside extrusion portion 55 of the conductive adhesive 33 in a cross section taken along C-C line (see FIG. 5).

Next, a method of manufacturing the above piezoelectric vibrator 10 will be explained.

Figure 7:
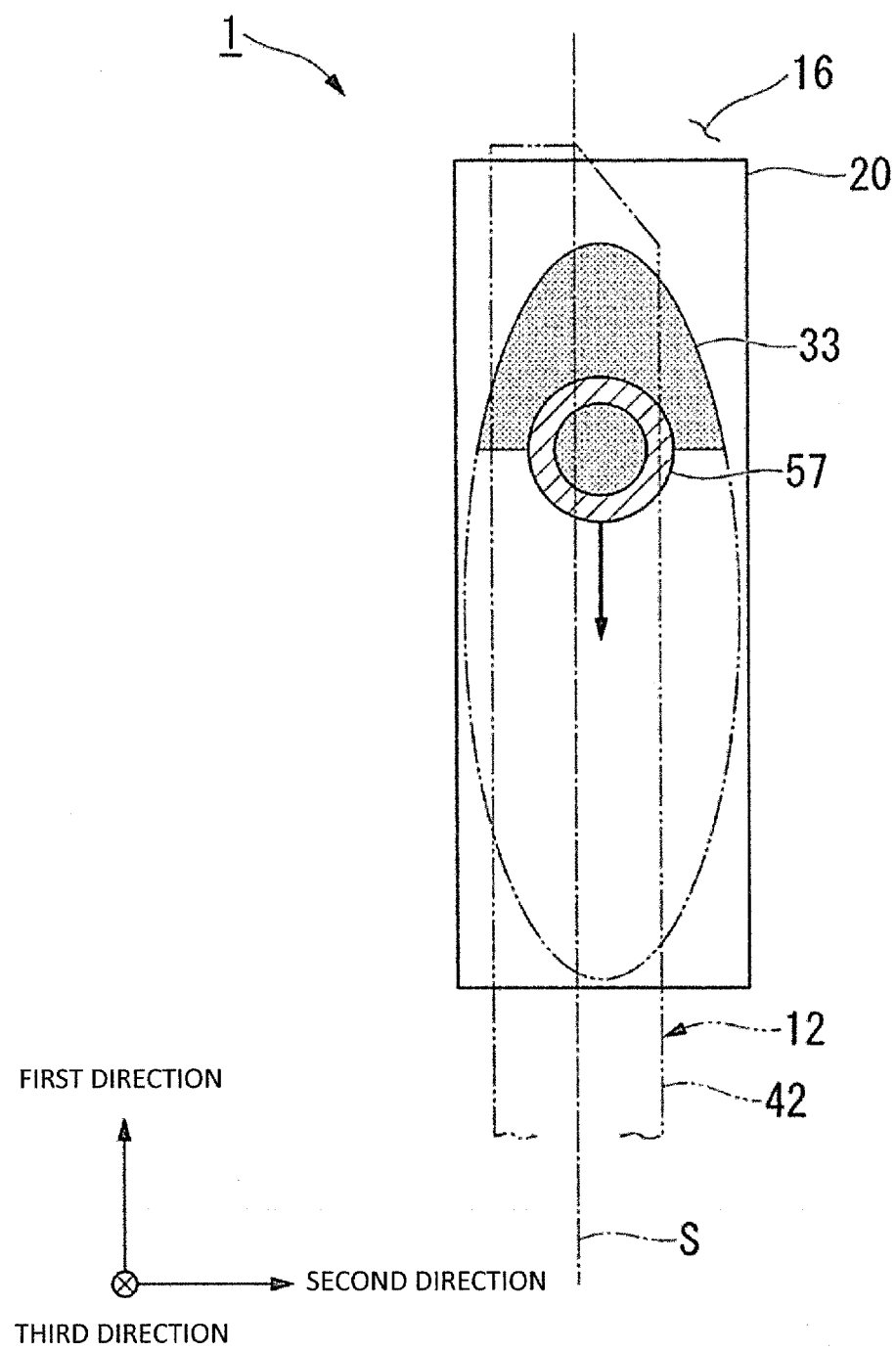
FIG. 7 is an explanatory view of an application process of a conductive adhesive.
Figure 8:
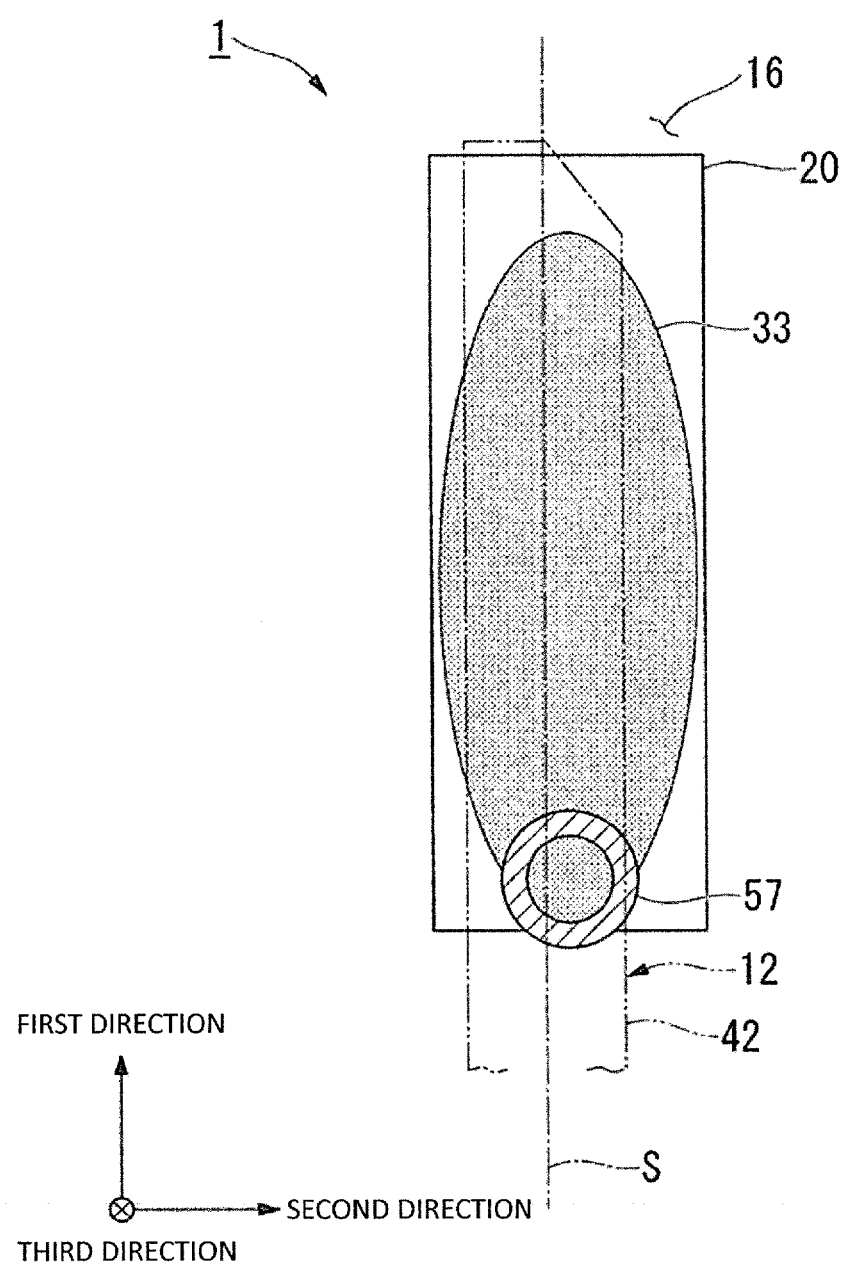
FIG. 8 is a plan view of the conductive adhesive in a state when the application is completed.

FIG. 7 is an explanatory view of the application process of the conductive adhesive and FIG. 8 is a plan view of the conductive adhesive in a state when the application is completed. In FIG. 7 and FIG. 8, the piezoelectric vibrating reed 12 is shown by a two-dot dashed line. Also in FIG. 7 and FIG. 8, only the first electrode pad 20 side is shown. Also in FIG. 7 and FIG. 8, a boundary of an intermediate part in the width direction (corresponding to the second direction in the embodiment) of the first support arm 42 is shown by a central line S extending along the first direction. In FIG. 7, the conductive adhesive 33 during application is shown, in which the applied conductive adhesive 33 is shown by a solid line and the conductive adhesive 33 to be applied is shown by a two-dot dashed line.

As shown in FIG. 7, the method of manufacturing the piezoelectric vibrator 10 according to the embodiment includes the application process and the mount process.

In the method of manufacturing the piezoelectric vibrator 10, first, the upper layer base substrate 16 is held on a component mounting stage of a mounting apparatus (not shown). A supply nozzle 57 supported by a movable head of an application apparatus (not shown) is arranged with respect to the held upper base substrate 16.

Next, in the application process, the supply nozzle 57 applies the conductive adhesive 33 to the first electrode pad 20 and the second electrode pad 21 in the upper base substrate 16 by discharging the conductive adhesive 33.

Here, the supply nozzle 57 moves straight along the first direction above the first electrode pad 20 in the upper base substrate 16 in a state where an opening center is positioned in the outer side of the central line S in the width direction (the second direction in the embodiment) of the first support arm 42 to be mounted. Accordingly, the supply nozzle 57 can apply the conductive adhesive 33 having the elliptical shape in plan view which has a long axis extending in the outer side of the central line S along the first direction as shown in FIG. 8. The application of the conductive adhesive 33 can be sequentially performed to the first electrode pad 20 and the second electrode pad 21 one by one as well as can be performed to the first electrode pad 20 and the second electrode pad 21 at the same time.

After the application process, the mount process is performed. In the mount process, first, the base 38 of the piezoelectric vibrating reed 12 housed in a container such as a pallet is sucked by the suction nozzle 60 (see FIG. 5) installed in the movable head. Next, the piezoelectric vibrating reed 12 is lifted up and moved to above the upper layer base substrate 16 in the state where the base 38 of the piezoelectric vibrating reed 12 is sucked. Subsequently, the piezoelectric vibrating reed 12 is positioned with respect to the first electrode pad 20 and the second electrode pad 21 on the upper layer base substrate 16. Then, the suction nozzle 60 is moved downward and the piezoelectric vibrating reed 12 is placed on the upper layer base substrate 16. At this time, the first support arm 42 and the second support arm 43 of the piezoelectric vibrating reed 12 are pressed onto the conductive adhesive 33 applied to the first electrode pad 20 and the second electrode pad 21. The mount process is completed in a point when the conductive adhesive 33 dries and the piezoelectric vibrating reed 12 is bonded and fixed to the upper layer base substrate.

After that, the manufacturing process of the piezoelectric vibrator 10 ends in a point when the cavity C is hermetically sealed by the sealing ring 17 and the sealing plate 14 to form the package 11.

In the embodiment, the extrusion amount of the conductive adhesive 33 in the inner side of the pair of first support arm 42 and second support arm 43 is smaller than the extrusion amount of the conductive adhesive 33 in the outer side of the pair of first support arm 42 and second support arm 43. Accordingly, when the piezoelectric vibrating reed 12 sucked and carried by the suction nozzle 60 is mounted on the package 11, it is possible to restrain the conductive adhesive 33 extruding to the inner side of the pair of first support arm 42 and second support arm 43 which are closer to the suction nozzle 60 from being sucked by the suction nozzle 60, flowing out and adhering to the first vibrating arm 31 and the second vibrating arm 32. Therefore, the piezoelectric vibrator 10 capable of preventing the conductive adhesive 33 from adhering to the first vibrating arm 31 and the second vibrating arm 32, reducing the size and securing good vibration characteristics can be obtained.

As the conductive adhesive 33 has the elliptical shape in plan view having the long axis along the first direction, the piezoelectric vibrating reed 12 can be firmly bonded to the upper layer base substrate 16 while suppressing the extrusion amount of the conductive adhesive 33 in the inner side of the first vibrating arm 31 and the second vibrating arm 32. Accordingly, the piezoelectric vibrator 10 capable of preventing the conductive adhesive 33 from adhering to the first vibrating arm 31 and the second vibrating arm 32, reducing the size, securing good vibration characteristics and having good durability can be obtained.

Moreover, the conductive adhesive 33 is arranged closer to the tip end side with respect to the intermediate part in the first direction, therefore, the conductive adhesive 33 is arranged in a position apart from the suction nozzle 60 which sucks the base 38 in the direction along the first direction. Accordingly, it is possible to surely prevent the conductive adhesive 33 from being sucked by the suction nozzle 60 which sucks the base 38. Therefore, the piezoelectric vibrator 10 capable of preventing the conductive adhesive 33 from adhering to the first vibrating arm 31 and the second vibrating arm 32, reducing the size and securing good vibration characteristics can be obtained.

As the height of the conductive adhesive 33 in the inner side of the first vibrating arm 31 and the second vibrating arm 33 from the surface of the upper layer base substrate 16 is lower than the height of the conductive adhesive 33 in the outer side of the first vibrating arm 31 and the second vibrating arm 33 from the surface of the upper layer base substrate 16, the extrusion portion of the conductive adhesive 33 in the inner side of the first vibrating arm 31 and the second vibrating arm 33 is positioned in a position apart from the suction nozzle 60 which sucks the base 38 in the height direction from the upper layer base substrate 16 as compared with the extrusion portion in the outer side of the first vibrating arm 31 and the second vibrating arm 33. Accordingly, it is possible to surely prevent the conductive adhesive 33 from being sucked by the suction nozzle 60 which sucks the base 38. Therefore, the piezoelectric vibrator 10 capable of preventing the conductive adhesive 33 from adhering to the first vibrating arm 31 and the second vibrating arm 32, reducing the size and securing good vibration characteristics can be obtained.

In the application process, the conductive adhesive 33 is applied in a state where the opening center in the tip end of the supply nozzle 57 is positioned in the outer side of the intermediate part in the width direction of each of the first support arm 42 and the second support arm 43, therefore, more conductive adhesive 33 is applied to the outer side than to the intermediate part in the width direction (the second direction in the embodiment) of the first support arm 42 and the second support arm 43. At this time, in the mount process for the piezoelectric vibrating reed 12 the extrusion amount of the conductive adhesive 33 in the inner side of the first support arm 42 and the second support arm 43 is controlled to be smaller than the extrusion amount of the conductive adhesive 33 in the outer side of the first support arm 42 and the second support arm 43. Therefore, it is possible to surely prevent the conductive adhesive 33 from being sucked by the suction nozzle 60 which sucks the base 38. Accordingly, the piezoelectric vibrator 10 capable of preventing the conductive adhesive 33 from adhering to the first vibrating arm 31 and the second vibrating arm 32, reducing the size and securing good vibration characteristics can be obtained.

The embodiment of the present invention has been explained with reference to the drawings, however, specific configurations are not limited to the embodiment and include design alterations within a scope not departing from the gist of the present invention.

Although the pair of first support arm 42 and second support arm 43 extend along the first direction, the pair of first support arm 42 and second support arm 43 may be formed in a direction crossing the first direction. More specifically, the pair of first support arm 42 and second support arm 43 may be provided obliquely, for example, so that a separation distance therebetween is gradually increased from the base end side of the piezoelectric vibrating reed 12 toward the tip end side.

It is possible to appropriately replace the components in the above embodiment with well-known components within a scope not departing from the gist of the present invention.

What is claimed is:

1. A piezoelectric vibrator having a piezoelectric vibrating reed mounted on a substrate through a conductive adhesive, the piezoelectric vibrating reed comprising:
    a pair of vibrating arms extending along a first direction and arranged side by side in a second direction perpendicular to the first direction;
    a base supporting the pair of vibrating arms; and
    a pair of support arms positioned on an outer side of the pair of vibrating arms in the second direction, the pair of support arms bonded to the substrate,
    wherein the conductive adhesive extends along an inner sidewall of the support arms and along an outer sidewall of the support arms, and
    wherein an extrusion amount of the conductive adhesive on the inner sidewall of the support arms is smaller than an extrusion amount of the conductive adhesive on the outer sidewall of the support arms in bonded portions between the support arms and the substrate.

2. The piezoelectric vibrator according to claim 1, wherein the conductive adhesive has an elliptical shape in plan view having a long axis along the first direction.

3. The piezoelectric vibrator according to claim 1, wherein the conductive adhesive is arranged closer to a tip end side with respect to an intermediate part in the first direction.

4. The piezoelectric vibrator according to claim 1, wherein a height of the conductive adhesive on the inner sidewall of the support arms from a surface of the substrate is lower than a height of the conductive adhesive on the outer sidewall of the support arms from the surface of the substrate.

* * * * *